(12) United States Patent
Tan et al.

(10) Patent No.: US 9,318,399 B2
(45) Date of Patent: Apr. 19, 2016

(54) SEMICONDUCTOR WAFERS EMPLOYING A FIXED-COORDINATE METROLOGY SCHEME AND METHODS FOR FABRICATING INTEGRATED CIRCUITS USING THE SAME

(71) Applicant: GLOBALFOUNDRIES Singapore Pte. Ltd., Singapore (SG)

(72) Inventors: Soon Yoeng Tan, Singapore (SG); Hui Leang Ong, Clifton Park, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 224 days.

(21) Appl. No.: 14/134,328

(22) Filed: Dec. 19, 2013

(65) Prior Publication Data
US 2015/0179535 A1    Jun. 25, 2015

(51) Int. Cl.
*H01L 23/544* (2006.01)
*H01L 21/66* (2006.01)
*G06F 17/50* (2006.01)

(52) U.S. Cl.
CPC .......... *H01L 22/34* (2013.01); *G06F 17/5072* (2013.01); *H01L 23/544* (2013.01); *H01L 22/30* (2013.01); *H01L 2223/5446* (2013.01); *H01L 2223/54426* (2013.01); *H01L 2924/0002* (2013.01)

(58) Field of Classification Search
CPC ....................................................... H01L 22/34
USPC .......................................................... 257/48
See application file for complete search history.

(56) References Cited

U.S. PATENT DOCUMENTS

| 4,343,877 | A  | * | 8/1982  | Chiang ............... G03F 7/70541 257/48 |
| 5,701,013 | A  | * | 12/1997 | Hsia ....................... B82Y 35/00 250/491.1 |
| 7,316,935 | B1 | * | 1/2008  | Hata ....................... H01L 22/32 257/48 |
| 2005/0085032 | A1 | * | 4/2005 | Aghababazadeh  G01R 31/2831 438/232 |
| 2006/0273391 | A1 | * | 12/2006 | Diaz ................. H01L 29/66659 257/335 |
| 2013/0062603 | A1 | * | 3/2013  | Maling ................ B81C 99/004 257/48 |

(Continued)

*Primary Examiner* — Andy Huynh
*Assistant Examiner* — Sitaramarao S Yechuri
(74) *Attorney, Agent, or Firm* — Ingrassia Fisher & Lorenz, P.C.

(57) ABSTRACT

Semiconductor wafers employing a fixed coordinate metrology scheme and methods for fabricating integrated circuits using the same are disclosed. In an exemplary embodiment, a semiconductor wafer employing a fixed-coordinate metrology scheme includes an external scribe region in the form of a first rectangular ring, the first rectangular ring defining a first interior space inward from the external scribe region and an interior scribe region in the form of a second rectangular ring, disposed within the first interior space and immediately adjacent to the external scribe region at all points along its exterior perimeter, the second rectangular ring defining a second interior space inward from the interior scribe region, the second interior space being wholly within the first interior space. The semiconductor wafer further includes a technology-specific tile region disposed within the second interior space and immediately adjacent to the interior scribe region and an electrical testable scribe line measurement (ETSLM) region disposed within the second interior space and immediately adjacent to both the technology-specific tile region and the interior scribe region. Still further, the semiconductor wafer includes a free floorplan area disposed within the second interior space and immediately adjacent to both the ETSLM region and the interior scribe region.

17 Claims, 6 Drawing Sheets

(56) References Cited

U.S. PATENT DOCUMENTS

2013/0075725 A1* 3/2013 Huang .................. H01L 22/34 257/48

2013/0110448 A1 5/2013 Hoffman, Jr. et al.
2014/0264336 A1* 9/2014 Lin ........................ H01L 22/34 257/335

* cited by examiner

SEMICONDUCTOR WAFERS EMPLOYING A FIXED-COORDINATE METROLOGY SCHEME AND METHODS FOR FABRICATING INTEGRATED CIRCUITS USING THE SAME

TECHNICAL FIELD

The present disclosure generally relates to semiconductor wafers used in fabricating integrated circuits and methods for fabricating integrated circuits. More particularly, the present disclosure relates to a fixed-coordinate metrology scheme implemented on a semiconductor wafer and methods for fabricating integrated circuits using the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

The production process leading to the provision of integrated circuits on a large scale typically includes a plurality of processing steps that take place on a thin wafer of semiconductor material, for example a monocrystalline silicon wafer. The wafer is subjected to a plurality of chemical and physical treatments and to photolithographic processes that lead to the definition of a complex three-dimensional topography constituting the integrated circuit architecture. A single wafer may contain hundreds of integrated circuits commonly called "chips" and arranged side by side, for example, and separated by scribing lines.

The term "metrology" broadly refers to the measurement and testing of objects. Metrology schemes are commonly used in the fabrication of integrated circuits. Metrology schemes are often used to measure features formed on the wafers to ensure that the features meet desired specifications, including the layout and spacing of the various integrated chips to be fabricated on the wafer. Various metrology methods may be used following any number of steps in a fabrication sequence to ensure that the semiconductor devices are formed within desired specifications.

In some fabrication processes, the first step in fabricating an integrated circuit (subsequent to the design of the integrated circuit) includes the design "tape-out" process, which begins with sending tape-out forms to the integrated circuit manufacturer. Tape-out forms are data files describing manufacturing related data and other details, such as mask tooling information for manufacturers or technology information. After tape-out forms are generated, descriptions of a circuit will be sent for manufacture. In current practice, metrology schemes for the semiconductor wafer are prepared based on the tape-out form. Thus, for each new tape-form that is received by the manufacturer, a new metrology scheme needs to be implemented specific to the respective wafer design. Currently, the preparation of a new metrology scheme for each tape-out form takes about a week's worth of time to complete, thus undesirably delaying the semiconductor fabrication process, and increasing fabrication expenses.

Accordingly, it is desirable to provide improved metrology schemes and improved methods for fabricating integrated circuits that reduce the time and expense involved in the design and implementation of metrology schemes. Additionally, it is desirable to provide a fixed-coordinate metrology scheme and methods for fabricating integrated circuits using a fixed-coordinate metrology scheme that does not need to be re-designed for each tape-out form. Furthermore, other desirable features and characteristics of the present disclosure will become apparent from the subsequent detailed description and the appended claims, taken in conjunction with the accompanying drawings and the foregoing technical field and background.

BRIEF SUMMARY

Semiconductor wafers employing a fixed coordinate metrology scheme and methods for fabricating integrated circuits using the same are disclosed. In an exemplary embodiment, a semiconductor wafer employed a fixed-coordinate metrology scheme includes an external scribe region in the form of a first rectangular ring, the first rectangular ring defining a first interior space inward from the external scribe region and an interior scribe region in the form of a second rectangular ring, disposed within the first interior space and immediately adjacent to the external scribe region at all points along its exterior perimeter, the second rectangular ring defining a second interior space inward from the interior scribe region, the second interior space being wholly within the first interior space. The semiconductor wafer further includes a technology-specific tile region disposed within the second interior space and immediately adjacent to the interior scribe region and an electrical testable scribe line measurement (ETSLM) region disposed within the second interior space and immediately adjacent to both the technology-specific tile region and the interior scribe region. Still further, the semiconductor wafer includes a free floorplan area disposed within the second interior space and immediately adjacent to both the ETSLM region and the interior scribe region.

In another exemplary embodiment, a method for fabricating an integrated circuit using a fixed-coordinate metrology scheme includes preparing a fixed-coordinate metrology scheme in accordance with a tape-out form and in integrated circuit layout design received by an integrated circuit manufacturer. The fixed coordinate metrology scheme includes an external scribe region in the form of a first rectangular ring, the first rectangular ring defining a first interior space inward from the external scribe region and an interior scribe region in the form of a second rectangular ring, disposed within the first interior space and immediately adjacent to the external scribe region at all points along its exterior perimeter, the second rectangular ring defining a second interior space inward from the interior scribe region, the second interior space being wholly within the first interior space. The fixed coordinate metrology scheme further includes a technology-specific tile region disposed within the second interior space and immediately adjacent to the interior scribe region and an electrical testable scribe line measurement (ETSLM) region disposed within the second interior space and immediately adjacent to both the technology-specific tile region and the interior scribe region. Still further, the fixed coordinate metrology scheme includes a free floorplan area disposed within the second interior space and immediately adjacent to both the ETSLM region and the interior scribe region. The method further includes providing metrology markings to a semiconductor wafer in accordance with the fixed-coordinate metrology scheme and the tape-out form, forming ETSLM structures within the ETSLM region and forming technology-specific tile-containing chips within the technology-specific tile region, and fabricating a plurality of integrated circuit chips within the free floorplan area in accordance with the integrated circuit layout design.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary, or the following detailed description.

The present disclosure provides improved methods for the fabrication of integrated circuits that include the use of a fixed-coordinate metrology scheme. As used herein, the adjective "fixed-coordinate" is used in reference to the fact the each individual region of the metrology scheme (as will be described below) is placed within the same physical location on the semiconductor wafer (with respect to the coordinate system of the wafer) regardless of the tape-out form that is being implemented by the metrology scheme. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

The fixed-coordinate metrology schemes of the present disclosure may be implemented on a semiconductor wafer suitable for use in fabricating integrated circuits thereon. In some embodiments, the semiconductor wafer may be a silicon substrate having a (100) surface crystal orientation. The term "silicon substrate" is used herein to encompass the relatively pure silicon materials typically used in the semiconductor industry as well as silicon admixed with other elements such as germanium, carbon, and the like. A silicon substrate may be a bulk silicon wafer, or it may be a thin layer of silicon on an insulating layer (commonly known as silicon-on-insulator or "SOI") that, in turn, is supported by a carrier wafer. Alternatively, the semiconductor wafer can include alternative semiconductor materials such as germanium, gallium arsenide, or other semiconductor materials.

Figure 1:
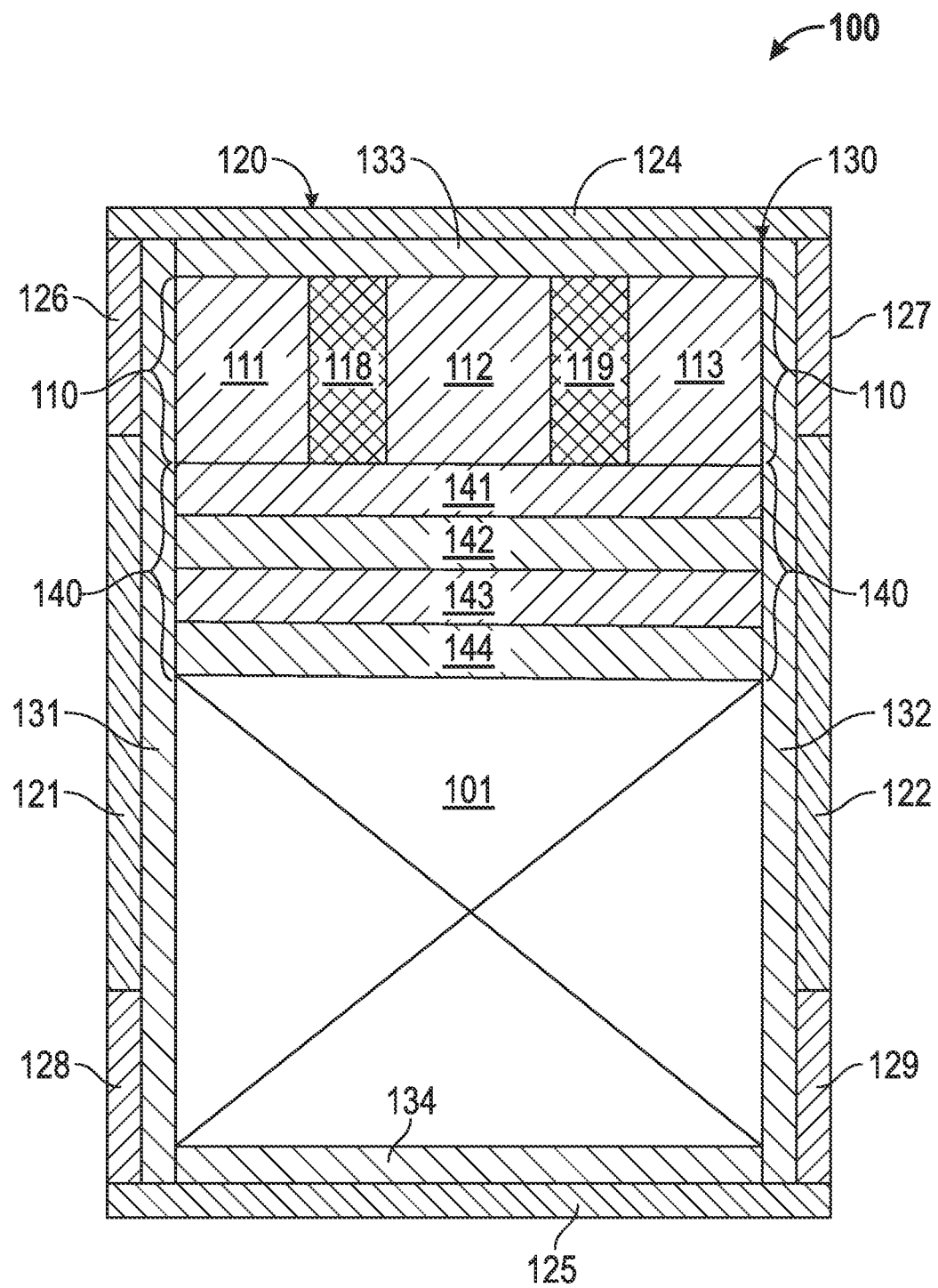
FIG. 1 illustrates an exemplary fixed-coordinate metrology scheme in accordance with various embodiments of the present disclosure.

FIG. 1 illustrates an exemplary fixed-coordinate metrology scheme 100 in accordance with various embodiments of the present disclosure that may be implemented on a semiconductor wafer in the fabrication of integrated circuits. As noted in the Background of this disclosure, it is presently known in the art to prepare and design a metrology scheme based on each individual tape-out form that is received by the integrated circuit manufacturer from the integrated circuit designer. Such preparation and design may take up to a week to perform. The fixed-coordinate metrology scheme 100 shown in FIG. 1, and described in greater detail below, is provided to allow for its use with multiple different tape-out forms, thus reducing the time required to fabricate an integrated circuit once the design thereof and the tape-out forms are received at the integrated circuit manufacturer.

The various regions of the metrology scheme 100, which are to be provided at the same location on the semiconductor wafer (with respect to the coordinate system thereof) regardless of the tape-out form being implemented will be briefly introduced in connection with the description of FIG. 1. Thereafter, the individual regions will be described in greater detail in connection with the description of FIGS. 2-5. As shown in FIG. 1, the fixed-coordinate metrology scheme 100 may include a "free floorplan area" 101. The free floorplan area 101 does not include any metrology markings, and is the area of the semiconductor wafer in which the various integrated circuit "chips" are to be fabricated, with scribe lines separating the various chips from one another. The free floorplan area is described in greater detail below with regard to FIG. 5.

The fixed-coordinate metrology scheme 100 may further include a technology-specific tile region 110. As will be appreciated, a semiconductor wafer may include integrated circuit chips (in free floorplan area 101) having different integrated circuit technologies, such as super low power (SLP), super high performance (SHP), high performance plus (HPP), low power high performance (LPH), and others as are known in the art. Thus, technology-specific tile region 110 may include a plurality of technology-specific tile-containing chips 111-113, which may be separated by separation (or blank) regions 118, 119. Each tile-containing chip 111-113 includes a plurality of technology-specific tiles, as will be discussed in greater detail below with regard to FIG. 4. These tiles include instructions and other information necessary in the fabrication of integrated circuits in accordance with the specific technology. Separation regions 118, 119 do not include any technology-specific tiles or other metrology markings, and are included in the metrology scheme to provide separation between the tile-containing chips 111-113. Further, although three tile-containing chips 111-113 are shown in the scheme of FIG. 1, separated by two separation regions 118, 119, it will be appreciated that more or fewer tile-containing chips may be provided in tile region 110, separated by a correspond number of separation regions.

With continued reference to FIG. 1, the fixed-coordinate metrology scheme 100 may further include an external scribe region 120. External scribe region 120 includes a plurality of scribe marking areas 124-129 and a plurality of machine vision system (MVS) target areas 121, 122. External scribe region 120 may generally occupy an outer-most "ring" of the fixed-coordinate metrology scheme 100. Scribe marking areas 124-129 are provided as regions in which a plurality of tape-out form-specific metrology markings may be provided, such as overlay markings and critical dimension (CD) markings (or other metrology markings), as will be discussed in greater detail below with regard to FIG. 2. MVS target areas 121, 122 are provided as regions in which alignment markings may be provided for particular lithography tools. For example, the term MVS refers to the alignment markings used with the Ultratech Lithography Tool available from Ultratech of San Jose, Calif., USA. Of course, if other tools are used, other markings may be provided in target areas 121, 122.

Additionally, the fixed-coordinate metrology scheme 100 may include an interior scribe region 130, positioned immediately adjacent to and within the external scribe region 120, and which defines a width of an electrical testable scribe line measurement (ETSLM) region 140. Scribe region 130 includes wafer alignment markings and other metrology markings, and is configured to provide spacing between the external scribe region 120, which include metrology markings, and a plurality of interior features of the metrology scheme 100, such as the free floorplan area 101 (including the integrated circuit chips), the technology-specific tile region 110 (including the technology-specific tile-containing chips 111-113), and the ETSLM region 140. Scribe region 130 includes at least two vertical frame elements 131, 132 and at least two horizontal frame elements 133, 134. Each of the frame elements 131-134 may include wafer alignment marking and/or other metrology markings, as dictate by the specific tape-out form provided. With regard to the ETSLM region 140, this region may include a plurality of horizontally-oriented ETSLM scribe regions 141-144, each of which may contain one or more ETSLM structures including, for example, probe check macros, FET macros, resistance macros, or other ETSLM structures as may be required for the specific tape-out form provided. As known in the art, probe check macros may be provided to determine whether there are any ET program errors, FET macros may be provided to predict chip performance, and resistance macros may be provided to test back-end-of line (BEOL) processes, for example the resistance of various metal wires deposited during BEOL processes. Of course, other macros as necessary and known in the art for a particular design may be provided in the scribe regions 141-144. Greater detail with regard to the interior scribe region 130 and the ETSLM region 140 is provided below in the description accompanying FIG. 3.

Figure 2:
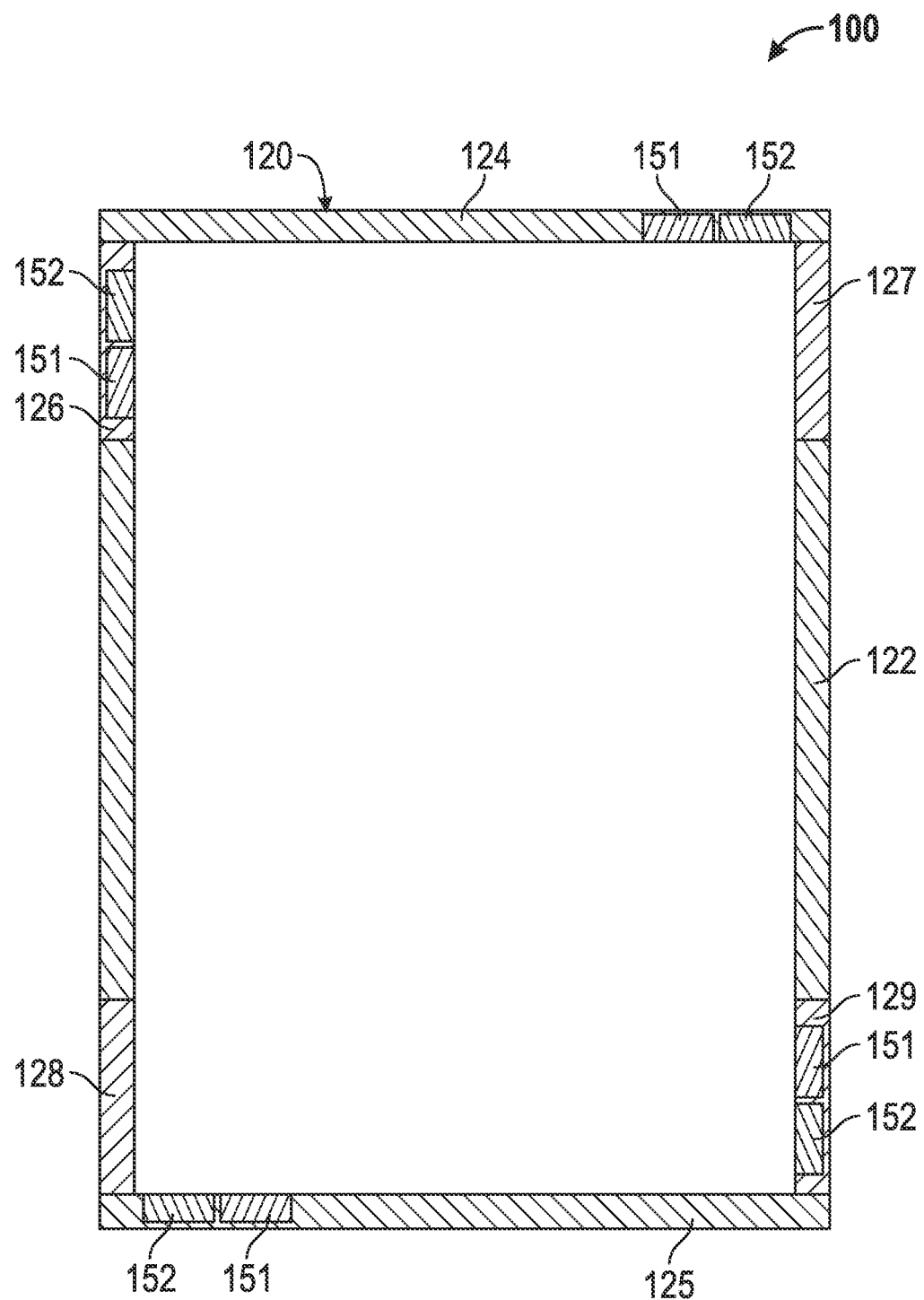
FIG. 2 illustrates the placement of certain metrology marks in the exemplary fixed-coordinate metrology scheme illustrated in FIG. 1.

Reference is now made to FIG. 2, which as noted above, illustrates in greater detail the external scribe region 120. While the area within region 120 is blank, it will be appreciated that this is done for ease of illustration and to place emphasis on the details of region 120; no difference in overall structure in comparison to the fixed-coordinate metrology scheme presented initially in FIG. 1 is intended. As shown in FIG. 2, the external scribe region 120 includes a plurality of scribe marking areas 124-129. At least two of the scribe marking areas 124, 125 may be horizontally oriented areas that define upper and lower portions of the region 120, which as noted above may be configured as a rectangular "ring." At least two MVS target areas 121, 122 may be vertically oriented and may be placed within side portions of the region 120. A plurality (for example four) vertically oriented scribe marking areas 126-129 may be provided to separate the MVS target areas 121, 122 from the horizontally oriented scribe marking areas 124, 125. For example, as shown in FIG. 2, a vertically oriented scribe marking area may be placed both above and below each of the MVS target areas 121, 122. Generally, any of the plurality of scribe marking areas 124-129 may include both CD metrology markings 151 and overlay metrology markings 152. However, not all of areas 124-129 need include either of such markings 151, 152. The placement of the markings 151, 152 will generally depend of the tape-out form provided. MVS target area 121 may be the MVS target, as described above, and may have dimensions, for example, of about 2044 microns in height and about 44 microns in width, and area 122 may be a chrome blank area, provided to avoid double printing by blocking all light from passing through a reticle. The height (vertical dimension) and length (horizontal dimension) of the scribe region 120 "ring" is dependent upon the particular semiconductor wafer size at issue, and varies across technology nodes. The width of each of the portions 121-129 (measured form the exterior of the ring to the interior of the ring) may be substantially equal, and may be from about 0.5 mm to about 3 mm, again depending on the particular semiconductor wafer size at issue. Thus, the external scribe region 120 may be placed in fixed coordinates with respect to the semiconductor wafer, while providing the flexibility to accommodate various different metrology marking schemes and MVS target schemes according to various different tape-out forms as may be received by the semiconductor manufacturer.

Figure 3:
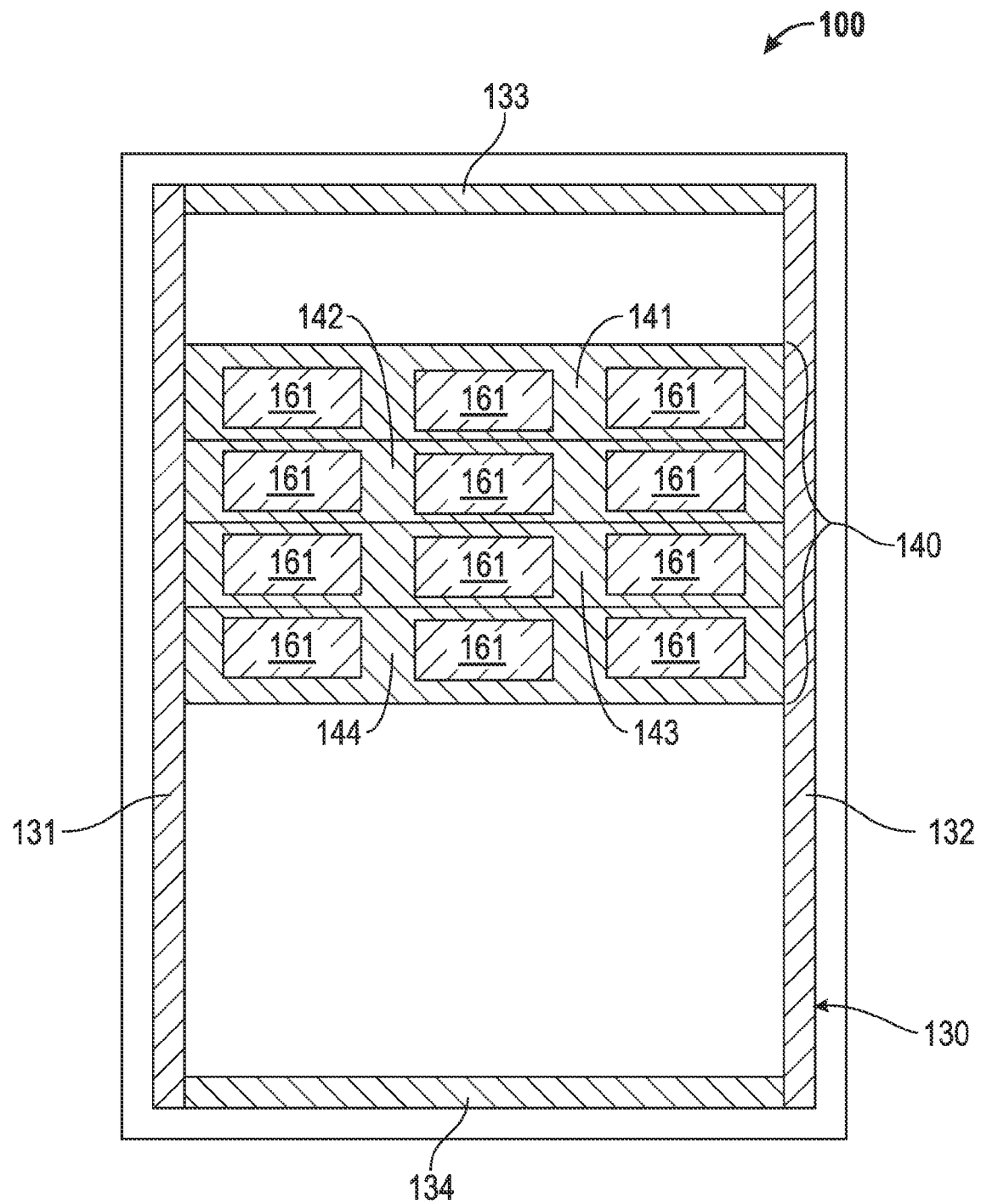
FIG. 3 illustrates the placement of a scribe ring and electrical testable scribe line measurement (ETSLM) structures in the exemplary fixed-coordinate metrology scheme illustrated in FIG. 1.

Reference is now made to FIG. 3, which as noted above illustrates in greater detail the interior scribe region 130 and the ETSLM region 140. While the area within region 130 is blank (excepting the ETSLM region 140), it will be appreciated that this is done for ease of illustration and to place emphasis on the details of regions 130 and 140; no difference in overall structure in comparison to the fixed-coordinate metrology scheme presented initially in FIG. 1 is intended. The interior scribe region is formed of at least two vertical frame elements 131, 132, positioned adjacent to and within the MVS target areas 121, 122 and the vertically oriented scribe marking areas 126-129, and at least two horizontal frame elements 133, 134, positioned adjacent to and within the horizontally oriented scribe marking areas 124, 125. Thus, interior scribe region 130 defines a rectangular "ring," concentrically within and adjacent to the region 120. The height (vertical dimension) and length (horizontal dimension) of the interior scribe region 130 "ring" is dependent upon the particular semiconductor wafer size at issue. The width of each of the frame elements 131-134 (measured form the exterior of the ring to the interior of the ring) may be substantially equal, and may be from about 0.5 mm to about 3 mm, again depending on the particular semiconductor wafer size at issue. Each of the frame elements 131-134 may include wafer alignment marking and/or other metrology markings (not separately illustrated), as dictated by the specific tape-out form provided. The content and placement of such markings will generally depend of the tape-out form provided. Thus, the interior scribe region 130 may be placed in fixed coordinates with respect to the semiconductor wafer, while providing the flexibility to accommodate various different metrology marking schemes according to various different tape-out forms as may be received by the semiconductor manufacturer.

With continued reference to FIG. 3, the ETSLM region 140 includes a plurality of horizontally-oriented ETSLM scribe regions 141-144, each of which may contain one or more ETSLM structures 161. Region 140 is provided between and adjacent to frame elements 131, 132, and immediately below and adjacent to technology-specific tile region 110 (which, as noted above, is provided immediately below and adjacent to frame element 133). Each of the structures 161 may include probe check macros, FETs, resistance macros, etc., as described above. Each region 141-144 may include one, two, three, or more ETSLM structures 161. The number of scribe regions 141-144 is provided may be dependent upon the particular tape-out form provided (for example, one, two, three, four, or more). The length (horizontal dimension) of the scribe region 120 "ring" is dependent upon the particular semiconductor wafer size at issue. The width of each of the portions regions 141-144 (measured in the same manner as the width of frame elements 133, 134) may be substantially equal, and may be from about 0.5 mm to about 3 mm, again depending on the particular semiconductor wafer size or technology node(s) at issue. Structures 161 may generally have lengths and widths that are less than the length and width of the regions 141-144, so as to fit within the bounds of regions 141-144.

Figure 4:
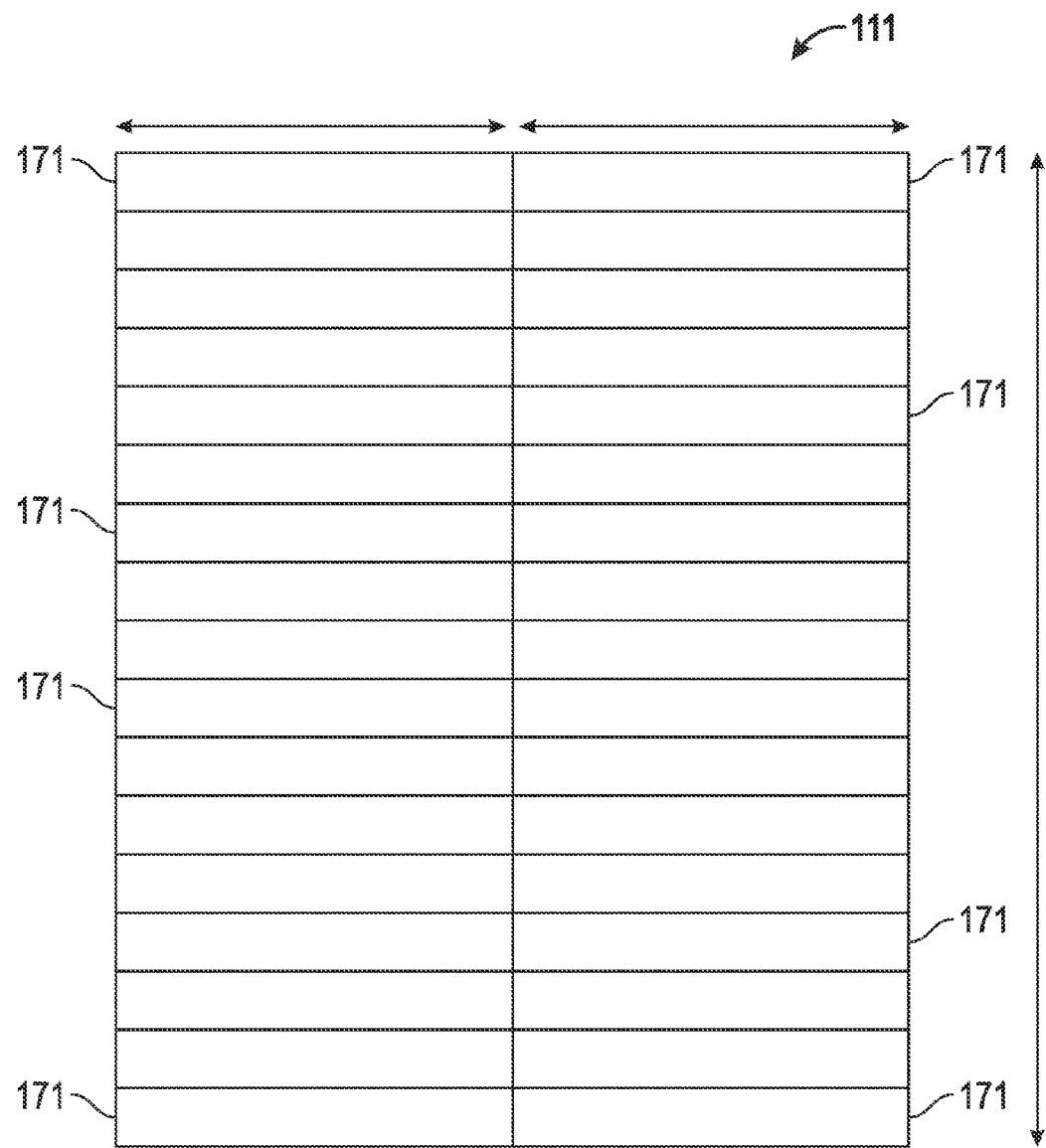
FIG. 4 illustrates the placement of technology-specific tile structures in the exemplary fixed-coordinate metrology scheme illustrated in FIG. 1.

With reference now to FIG. 4, as noted above, greater detail is provided regarding the technology-specific tile-containing chips 111-113 (an exemplary chip 111 is shown in FIG. 4). The illustrated technology-specific tile-containing chip 111 includes a plurality of technology-specific tiles 171, each of which may include instructions and other information necessary in the fabrication of integrated circuits (in free floorplan area 101) in accordance with the specific technologies of such integrated circuits, for example SLP, SHP, HPP, LPH, and others as are known in the art. A chip 111 may include one or more columns of tiles 171 (two are shown in FIG. 4), and one or more rows of tiles 171 (seventeen are shown in FIG. 4). The number of tile 171 provided is generally dependent on the specific technology and on the tape-out form provided, and may vary from embodiment to embodiment. The configuration of the chip 111 is generally square, and may have side lengths from about 3 mm to about 5 mm, for example about 4 mm, depending on the semiconductor wafer size. The tiles 171 may have a length of about 2 mm, and a height that is dependent upon the number of tiles required for a given technology. Thus, each of the tiles 111-113 may be placed in fixed coordinates with respect to the semiconductor wafer, while providing the flexibility to accommodate various numbers and configurations of tiles 171 according to various different technologies and tape-out forms as may be received by the semiconductor manufacturer.

Figure 5:
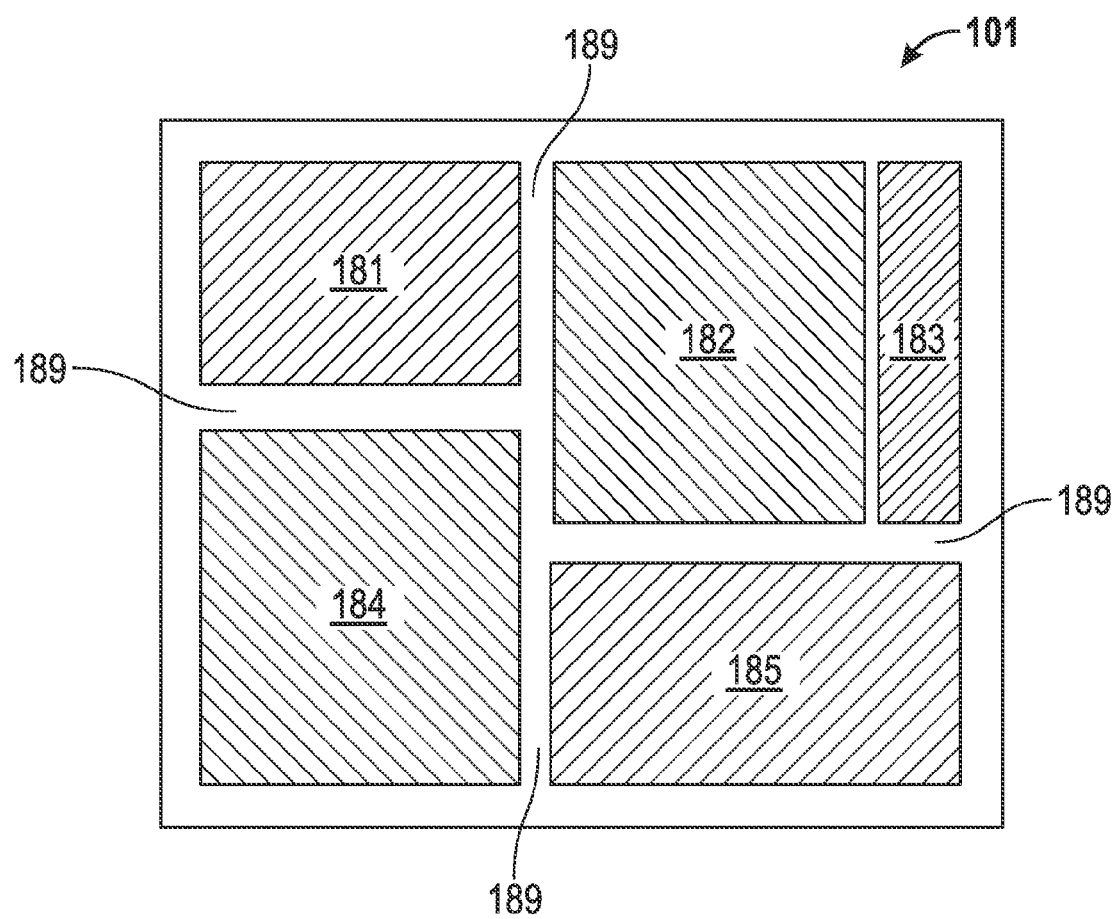
FIG. 5 illustrates the placement of integrated circuit chips in the exemplary fixed-coordinate metrology scheme illustrated in FIG. 1.

Further, with reference now to FIG. 5, greater detail is provided in connection with the free floorplan area 101. Free floor plan area 101 is provided between and adjacent to frame elements 131, 132, and immediately below and adjacent to ETSLM region 140. Free floorplan area 101 is also provided immediately above and adjacent to frame element 134. Generally speaking, free floorplan area 101 can include any number of integrated circuit chips 181-185, with scribe lines 189 being provided in between chips 181-185, and bordering the external boundaries of area 101. Various sizes and configurations of chips 181-185 may be included, as shown in FIG. 5. The overall size of free floorplan area 101 is dependent upon the size of the semiconductor wafer, and may vary from embodiment to embodiment. Thus, the free floorplan area 101 may be placed in fixed coordinates with respect to the semiconductor wafer, while providing the flexibility to accommodate various numbers and configurations of integrated circuit chips 181-185 according to various different technologies and tape-out forms as may be received by the semiconductor manufacturer.

Figure 6:
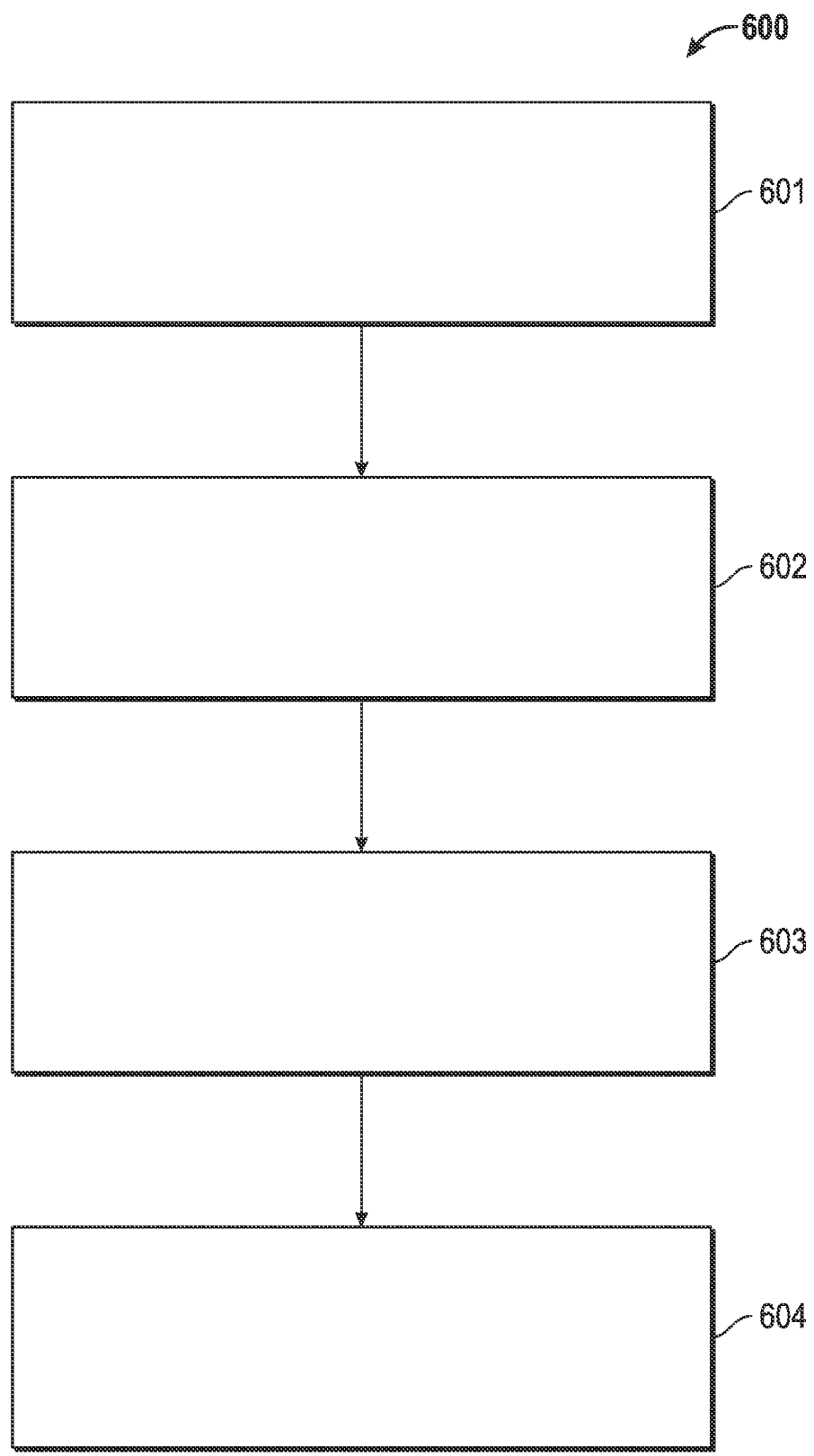
FIG. 6 is a flowchart illustrating an exemplary method for fabricating an integrated circuit using a fixed-coordinate metrology scheme in accordance with various embodiments of the present disclosure.

With the metrology scheme being configured with respect to the tape-out form and integrated circuit layout design received by the manufacturer, but within the fixed-coordinate metrology scheme described above, fabrication of the integrated circuit may commence in accordance with method 600 illustrated in the flowchart shown in FIG. 6. Method 600 includes a step 601 of preparing a fixed-coordinate metrology scheme in accordance with a tape-out form and in integrated circuit layout design received by the integrated circuit manufacturer. Step 601 is carried out in accordance with the principles described above regarding the fixed-coordinate metrology scheme 100, for example. Method 600 continues with step 602 of providing metrology markings to the semiconductor wafer in accordance with the fixed-coordinate metrology scheme 100. These markings may include, for example, any of the CD or overlay markings 151, 152 included within the external scribe region 120, or the wafer alignment and other metrology markings included within the interior scribe region 130. Method 600 also includes a step of forming the ETSLM structures 161 and the technology-specific tile-containing chips 111-113 on the semiconductor wafer in accordance with the tape-out form and the integrated circuit layout design, and also within the fixed-coordinate metrology scheme 100 (i.e., within regions 140 and 110, respectively). Further, method 600 includes a step 604 of fabricating the integrated circuit chips 181-185 within free floorplan area 101 in accordance with the integrated circuit layout design. Fabrication of the integrated circuit chips 181-185 may be performed using processing steps that as are well-known in the art (not illustrated). These steps conventionally include, for example, preparing photolithographic masks and using the masks to pattern a plurality of features on the semiconductor wafer using material deposition and etching procedures, for example, the formation of semiconductive structures, the formation of metals gates, forming various insulating layers, the formation of doped source and drain regions, the formation of contacts (formed by depositing a photoresist material layer over the insulating layer, lithographic patterning, etching to form contact voids, and depositing a conductive material in the voids to form the contacts), and the formation of one or more patterned conductive layers, among many others. The subject matter disclosed herein is not intended to exclude any subsequent processing steps to form and test the completed integrated circuits within free floorplan are 101 as are known in the art.

Accordingly, embodiments of the present disclosure provide a fixed-coordinate metrology scheme suitable for use in the fabrication of integrated circuits. The fixed coordinate-metrology scheme includes various regions that are placed in fixed coordinates with respect to the semiconductor wafer on which the integrated circuit is to be manufactured. Various metrology markings, ETSLM structures, technology-specific chips, and of course the integrated circuits themselves are placed within the fixed-coordinate regions according to the specific tape-out form and integrated circuit layout design being implemented. In this manner, it is possible to avoid the need to redesign and reconfigure a metrology scheme for each tape-out form received, thus saving significant fabrication time and expense.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor wafer employing a fixed-coordinate metrology comprising:
    an external scribe region in the form of a first rectangular ring, the first rectangular ring defining a first interior space inward from the external scribe region, wherein the external scribe region comprises a plurality of overlay markings and/or critical dimension (CD) markings, and wherein the external scribe region comprises, as the first rectangular ring, two horizontal scribe marking areas defining upper and lower portions of the external scribe region and two MVS target areas disposed along opposite side regions of the external scribe region, each MVS target area being separated from the two horizontal scribe marking areas by two vertical scribe marking areas;
    an interior scribe region in the form of a second rectangular ring, disposed within the first interior space and immediately adjacent to the external scribe region at all points along its exterior perimeter, the second rectangular ring defining a second interior space inward from the interior scribe region, the second interior space being wholly within the first interior space;
    a technology-specific tile region disposed within the second interior space and immediately adjacent to the interior scribe region;
    an electrical testable scribe line measurement (ETSLM) region disposed within the second interior space and immediately adjacent to both the technology-specific tile region and the interior scribe region; and
    a free floorplan area disposed within the second interior space and immediately adjacent to both the ETSLM region and the interior scribe region.

2. The semiconductor wafer of claim 1, wherein the horizontal and the vertical scribe marking areas comprise the overlay markings and/or CD markings, and wherein the MVS target areas comprise alignment markings for a specific lithography tool to be employed.

3. The semiconductor wafer of claim 1, wherein the interior scribe region comprises a plurality of wafer alignment markings.

4. The semiconductor wafer of claim 3, wherein the interior scribe region comprises at least two vertical frame elements and at least two horizontal frame elements to form the second rectangular ring.

5. The semiconductor wafer of claim 1, where the technology-specific tile region comprises a plurality of technology-specific tile-containing chips, each chip of the plurality of chips being separated from one another by a separation region.

6. The semiconductor wafer of claim 5, wherein each chip of the plurality of chips comprises a plurality of technology specific tiles, each technology specific tile comprising instructions regarding the fabrication of an integrated circuit according to a specific technology.

7. The semiconductor wafer of claim 6, wherein the specific technology is selected from the group consisting of: super low power (SLP), super high performance (SHP), high performance plus (HPP), low power high performance (LPH).

8. The semiconductor wafer of claim 1, wherein the ETSLM region comprises a plurality of ETSLM structures selected from the group consisting of: probe check macros, FETs, and resistance macros.

9. The semiconductor wafer of claim 8, wherein the ETSLM region comprises a plurality of horizontal frame elements, wherein the horizontal frame elements comprise the ETSLM structures.

10. The semiconductor wafer of claim 1, wherein the free floorplan area comprises a plurality of integrated circuit chips separated by scribe lines.

11. The semiconductor wafer of claim 10, wherein the free floorplan area is free of metrology markings.

12. A method for fabricating an integrated circuit comprising:
    preparing a fixed-coordinate metrology scheme in accordance with a tape-out form and in integrated circuit layout design received by an integrated circuit manufacturer, wherein the fixed coordinate metrology scheme comprises:
        an external scribe region in the form of a first rectangular ring, the first rectangular ring defining a first interior space inward from the external scribe region, wherein the external scribe region comprises a plurality of overlay markings and/or critical dimension (CD) markings, and wherein the external scribe region comprises, as the first rectangular ring, two horizontal scribe marking areas defining upper and lower portions of the external scribe region and two MVS target areas disposed along opposite side regions of the external scribe region, each MVS target area being separated from the two horizontal scribe marking areas by two vertical scribe marking areas;
        an interior scribe region in the form of a second rectangular ring, disposed within the first interior space and immediately adjacent to the external scribe region at all points along its exterior perimeter, the second rectangular ring defining a second interior space inward from the interior scribe region, the second interior space being wholly within the first interior space;
        a technology-specific tile region disposed within the second interior space and immediately adjacent to the interior scribe region;
        an electrical testable scribe line measurement (ETSLM) region disposed within the second interior space and immediately adjacent to both the technology-specific tile region and the interior scribe region; and
        a free floorplan area disposed within the second interior space and immediately adjacent to both the ETSLM region and the interior scribe region;
    providing metrology markings to a semiconductor wafer in accordance with the fixed-coordinate metrology scheme and the tape-out form;
    forming ETSLM structures within the ETSLM region and forming technology-specific tile-containing chips within the technology-specific tile region; and
    fabricating a plurality of integrated circuit chips within the free floorplan area in accordance with the integrated circuit layout design.

13. The method of claim 12, wherein providing metrology markings comprises providing metrology markings within the interior scribe region.

14. The method of claim 13, wherein providing metrology markings comprises providing wafer alignment markings within the interior scribe region.

15. The method of claim 14, wherein metrology markings are not provided within the free floorplan area.

16. The method of claim 12, wherein fabricating the plurality of integrated circuit chips comprises employing one or more of a masking, patterning, etching, or deposition procedure.

17. The method of claim 12, further comprising providing the semiconductor wafer.

\* \* \* \* \*